United States Patent [19]

Morris

[11] Patent Number: 5,952,848
[45] Date of Patent: Sep. 14, 1999

US005952848A

[54] HIGH-VOLTAGE TOLERANT INPUT BUFFER IN LOW-VOLTAGE TECHNOLOGY

[75] Inventor: Bernard L. Morris, Emmaus, Pa.

[73] Assignee: Lucent Technologies Inc., Murray Hill, N.J.

[21] Appl. No.: 08/818,844

[22] Filed: Mar. 14, 1997

[51] Int. Cl.[6] .................. H03K 19/0185; H03K 19/017
[52] U.S. Cl. ................................ 326/81; 326/17; 326/83
[58] Field of Search ................... 326/80–81, 68, 326/83, 112, 119, 121, 17

[56] References Cited

U.S. PATENT DOCUMENTS

| | | |
|---|---|---|
| 5,304,867 | 4/1994 | Morris . |
| 5,378,945 | 1/1995 | Partovi . |
| 5,432,467 | 7/1995 | Reddy . |
| 5,606,268 | 2/1997 | Van Brunt ................................ 326/81 |
| 5,670,898 | 9/1997 | Fang ........................................ 326/121 |

FOREIGN PATENT DOCUMENTS

| | | |
|---|---|---|
| 0 690 587 A1 | 1/1996 | European Pat. Off. . |
| 4-78221 | 3/1992 | Japan ....................................... 326/81 |

OTHER PUBLICATIONS

"Analog MOS Integrated Circuits for Signal Processing", by Roubik Gregorian and Gabor C. Temes, A Wiley–Interscience Publication, John Wiley & Sons, 1986, pp. 141–143.

"Fast Level Converter Circuit" by Anonymous, IBM Technical Disclosure Bulletin, New York, May 1987, vol. 29 No. 12, p. 5167.

"A Quarter–micron SIMOX–CMOS LVTTL–compatible Gate Array with an over 2,000 V ESB–protection circuit" by Yusuke Ohtomo, et al., Proceedings of the IEEE 1996 Custom Integrated Circuits Conference (CICC), San Diego, May 1996, pp. 57–60.

Primary Examiner—Jon Santamauro

[57] ABSTRACT

The input buffer of a low-voltage technology integrated circuit (IC) has a buffer transistor adapted to receive an input signal at the gate of the input buffer. The channel nodes of the input buffer are connected to other circuitry (e.g., the low-voltage bias voltage and a current source). With such an input buffer, the low-voltage circuit can safely receive a relatively high input voltage. As such, the low-voltage circuit can be interfaced to and safely operated in conjunction with relatively high-voltage technology circuitry. In one implementation, IC circuitry of existing 5V technology can be safely used with IC circuitry of a new 2.5V technology having an input buffer of the present invention.

22 Claims, 3 Drawing Sheets

HIGH-VOLTAGE TOLERANT INPUT BUFFER IN LOW-VOLTAGE TECHNOLOGY

BACKGROUND OF THE INVENTION

1. Field of the Invention

The present invention relates to integrated circuits, and, in particular, to integrated circuits that are made in a low-voltage technology and designed to operate with integrated circuits that are made in a relatively high-voltage technology.

2. Description of the Related Art

Advances in integrated-circuit (IC) technology often relate to the ever decreasing operating voltages required to operate such circuits. A lower operating voltage may translate into lower costs due to decreases in circuit size and power consumption.

Nevertheless, when a new low-voltage IC technology is developed, it is often desirable for that new technology to be able to operate with existing relatively high-voltage circuitry. The voltage of a particular technology is typically defined by the gate-oxide breakdown voltage and/or the punch-through between the source and drain. One potential problem with interfacing low-voltage circuitry with high-voltage circuitry is that, if the voltages applied to the low-voltage circuitry get too high, one or more of the devices in the low-voltage circuitry may experience temporary or even permanent damage that can inhibit its ability to function properly.

Moreover, as gate oxides continue to shrink to achieve higher speeds, the ability of a metal-oxide semiconductor (MOS) transistor to tolerate higher voltages across the gate or from drain to source is decreased. This can be a problem in interface circuits, generally known as input/output (I/O) buffers, that are part of low-voltage circuitry that is to be connected to relatively high-voltage circuitry.

It is therefore desirable to design I/O buffers for low-voltage circuitry that are able to handle relatively high voltages so that the low-voltage circuitry can be interfaced and operated with high-voltage circuitry.

SUMMARY OF THE INVENTION

The present invention is directed to integrated circuits in a low-voltage technology having an input buffer that enables the low-voltage circuitry to be interfaced and operated with relatively high-voltage circuitry. Embodiments of the present invention are directed to an integrated circuit in a low-voltage technology having an input buffer coupled to other low-voltage technology circuitry. The input buffer comprises a buffer transistor coupled at one channel node to a reference voltage VDD and coupled at the other channel node to a current source. The gate of the buffer transistor is adapted to receive an input voltage to the input buffer and the source of the buffer transistor is adapted to provide a voltage to the other low-voltage technology circuitry.

The present invention is also directed to a method for buffering high-voltage inputs using integrated circuitry implemented in a low-voltage technology. A reference voltage VDD is applied to one channel node of a buffer transistor (e.g., M1 of FIG. 2) of an input buffer of the integrated circuitry, and a current source is applied to the other channel node of the buffer transistor, wherein the two channel nodes are the source and the drain of the buffer transistor. An input voltage of magnitude up to 2(VDD) is applied to the gate of the buffer transistor, such that the source of the buffer transistor provides a voltage to other low-voltage technology circuitry.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

Figure 1:
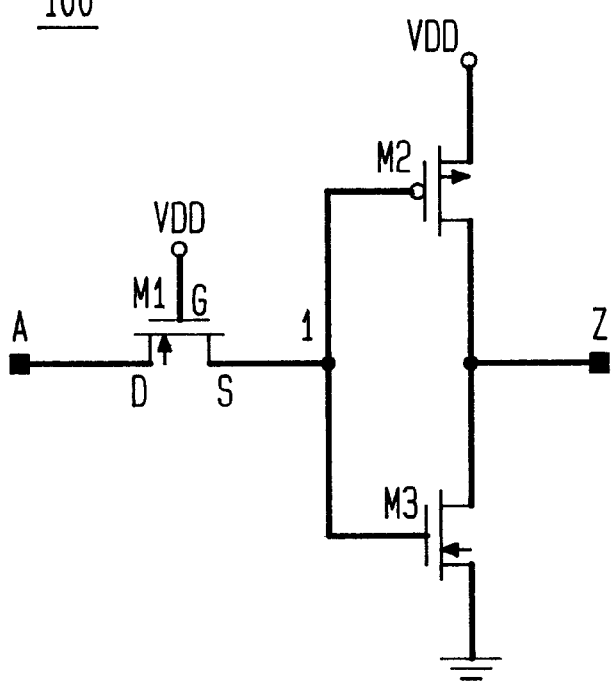
FIG. 1 shows a schematic diagram of a prior-art input-buffer circuit made using a 3.3V IC technology.

FIG. 1 shows a schematic diagram of a prior-art input-buffer circuit 100, made using a 3.3V IC technology. Input-buffer circuit 100 may be used to accept input signals at node A as high as (and possibly higher than) 5 volts. In FIG. 1, transistor M1 operates as a pass transistor between the input signal on node A and an inverter formed by transistors M2 and M3. The voltage at node 1 (V1) is clamped to a maximum value given by Equation (1) as follows:

$$V1 = VDD - VGS1 \quad (1)$$

where VDD is the bias voltage (e.g., 3.3V) and VGS1 is the gate-to-source voltage of transistor M1. Since the gate-to-source voltage VGS1 is typically 1V, the voltage at node 1 (and therefore the voltage at the gates of transistors M2 and M3) never exceeds 2.3V (assuming VDD=3.3V). The drain-to-source voltage VDS1 (i.e., the voltage drop across transistor M1) is given by Equation (2) as follows:

$$VDS1 = VA - V1 \quad (2)$$

where VA is the voltage at node A. Thus, even when the voltage at node A (VA) is 5V, the drain-to-source voltage VDS1 does not exceed (VA−V1)=(5V−2.3V)=2.7V, and the gate voltage of M1 never exceeds VDD. Since 3.3V-technology devices can tolerate these voltage levels, 3.3V-technology circuit 100 of FIG. 1 can be safely interfaced (at node A) with and operated in conjunction with existing 5V-technology circuitry.

If, however, circuit 100 of FIG. 1 is implemented with a 2.5V technology, sufficient protection is not provided. At VDD=2.5V, according to Equation (1), the voltage V1 at node 1 can go down to 1.5V (2.5V−1V). This, in turn, according to Equation (2), allows a drain-to-source voltage VDS1 of (VA−V1)=(5V−1.5V)=3.5V, which is well in excess of the tolerable limits for 2.5V technology. In particular, a VDS1 of 3.5V can cause transistor M1 to punch through (i.e., short out) resulting in improper operation of the circuit.

Figure 2:
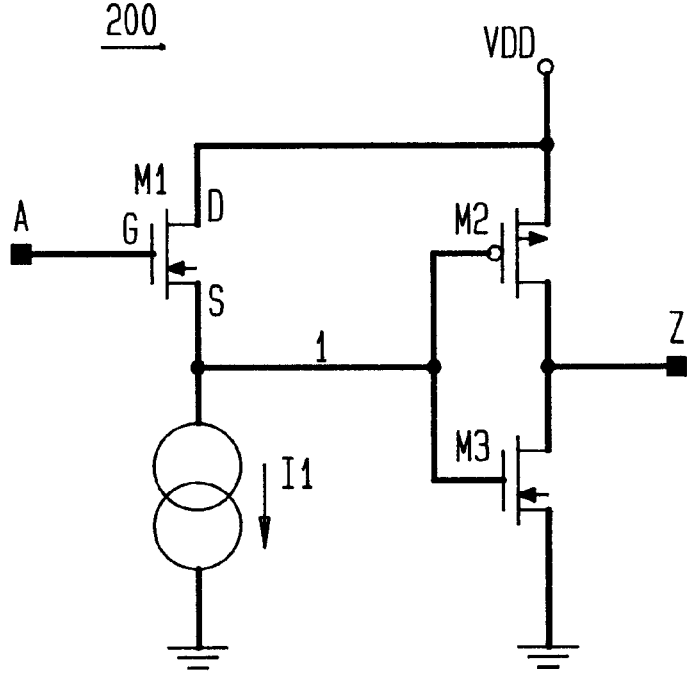
FIGS. 2–5 show schematic diagrams of input-buffer circuits, according to different embodiments of the present invention.

FIG. 2 shows a schematic diagram of input-buffer circuit 200, according to one embodiment of the present invention. Circuit 200 is implemented using a 2.5V technology. In circuit 200, the input voltage is applied to the gate of an n-channel transistor M1, which operates as a source follower transistor. The source of transistor M1 is connected to ground through a current source I1. The voltage drop between the gate and source of transistor M1 (VGS1) is given by Equation (3) as follows:

$$VGS1 = VA - V1 \quad (3)$$

where VA is the input voltage at node A and V1 is the voltage at node 1, where V1 cannot exceed VDD (e.g., 2.5V). When VA is 0 volts, transistor M1 is off and VDS1 (the drain-to-source voltage of transistor M1) is less than or equal to VDD (2.5V). As VA increases from 0 to 5 volts, transistor M1 turns on, current is drawn through transistor M1 by current source I1, and V1 is clamped at VDD. When VA is 5 volts, V1 can be, at most, VDD (2.5V). According to Equation (3), this means that VGS1 cannot be greater than (VA−V1) or (5V−2.5V) or 2.5V. Similarly, the maximum gate-to-drain voltage VGD1 of transistor M1 is given by (VA−VDD) or (5V−2.5V) or 2.5V. All of the relevant voltages (i.e., VGS1, VDS1, and VGD1) are always less than 2.5 volts for input voltages VA up to 5 volts. As such, the input buffer of low-voltage circuit 200 can be safely interfaced to and operated in conjunction with circuitry of a 5V technology.

Transistors M2 and M3 form an inverter that is used to buffer the source follower input. Those skilled in the art will understand that the inverter of circuit 200 may be replaced by other suitable 2.5V-technology circuitry.

Figure 3:
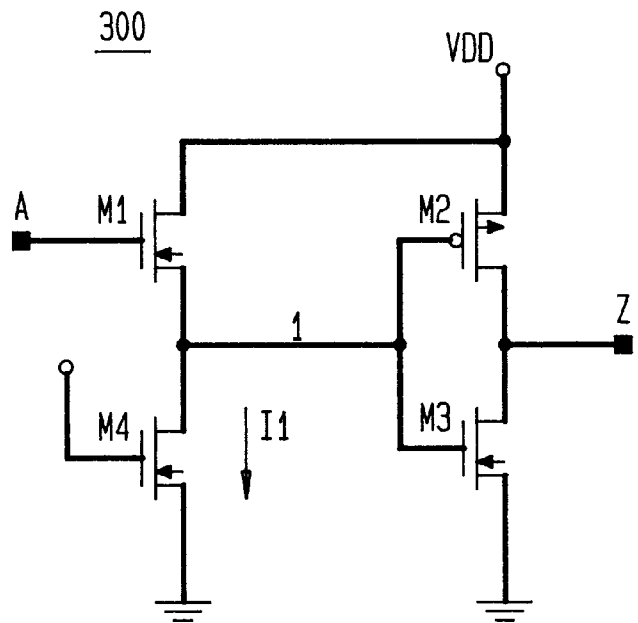

FIG. 3 shows a schematic diagram of input-buffer circuit 300, according to another embodiment of the present invention. Circuit 300 is an implementation of circuit 200 of FIG. 2, with the ideal current source I1 replaced by an MOS transistor (M4) acting as a resistor. In an alternative implementation, the ideal current source I1 may be replaced by an actual resistor. In either case, one drawback to circuit 300 is that it can consume considerable DC power in the high state. Increasing the resistance of transistor M4 lowers this power, but at the expense of decreasing circuit speed.

Figure 4:
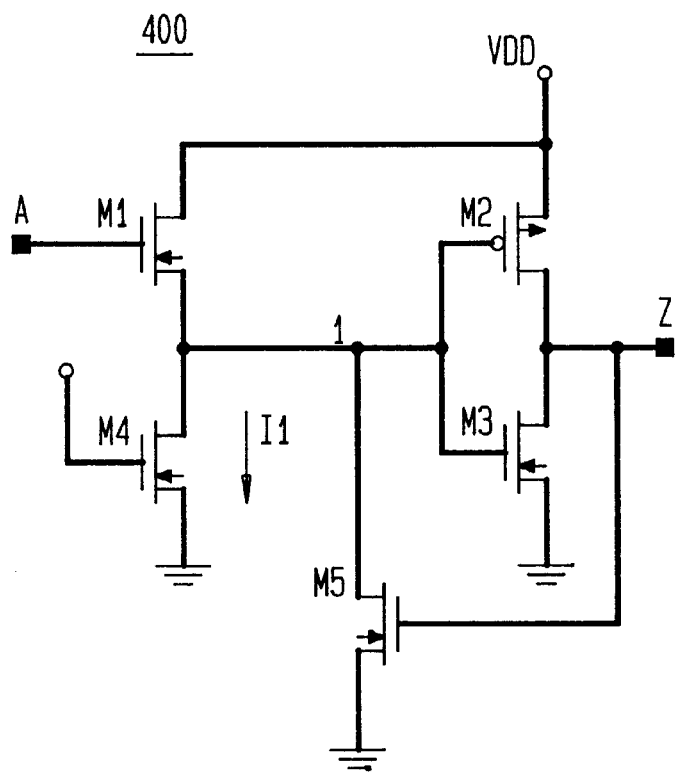

FIG. 4 shows a schematic diagram of input-buffer circuit 400, according to yet another embodiment of the present invention. Circuit 400 addresses the circuit-speed problem of circuit 300 by adding another transistor (M5). Transistor M5 preferably has a relatively low resistance, while transistor M4 has a relatively high resistance. When the input VA is high, a small amount of DC power is consumed by transistor M4. In this state, the voltage V1 at node 1 is high and the voltage VZ at node Z is low. As such, transistor M5 is off. When the input VA goes low, V1 goes low, aided by capacitive coupling of the gate-to-source of transistor M1. When V1 goes below the threshold of the inverter formed by transistors M2 and M3, which should be set fairly low, VZ goes high, turning on transistor M5 and quickly pulling V1 low. Likewise, when the input VA goes high again, transistor M5 will quickly turn off, lowering the DC power. Transistor M5 has the additional feature of providing some hysteresis to the input buffer of circuit 400, so that it acts like a Schmitt Trigger input.

Figure 5:
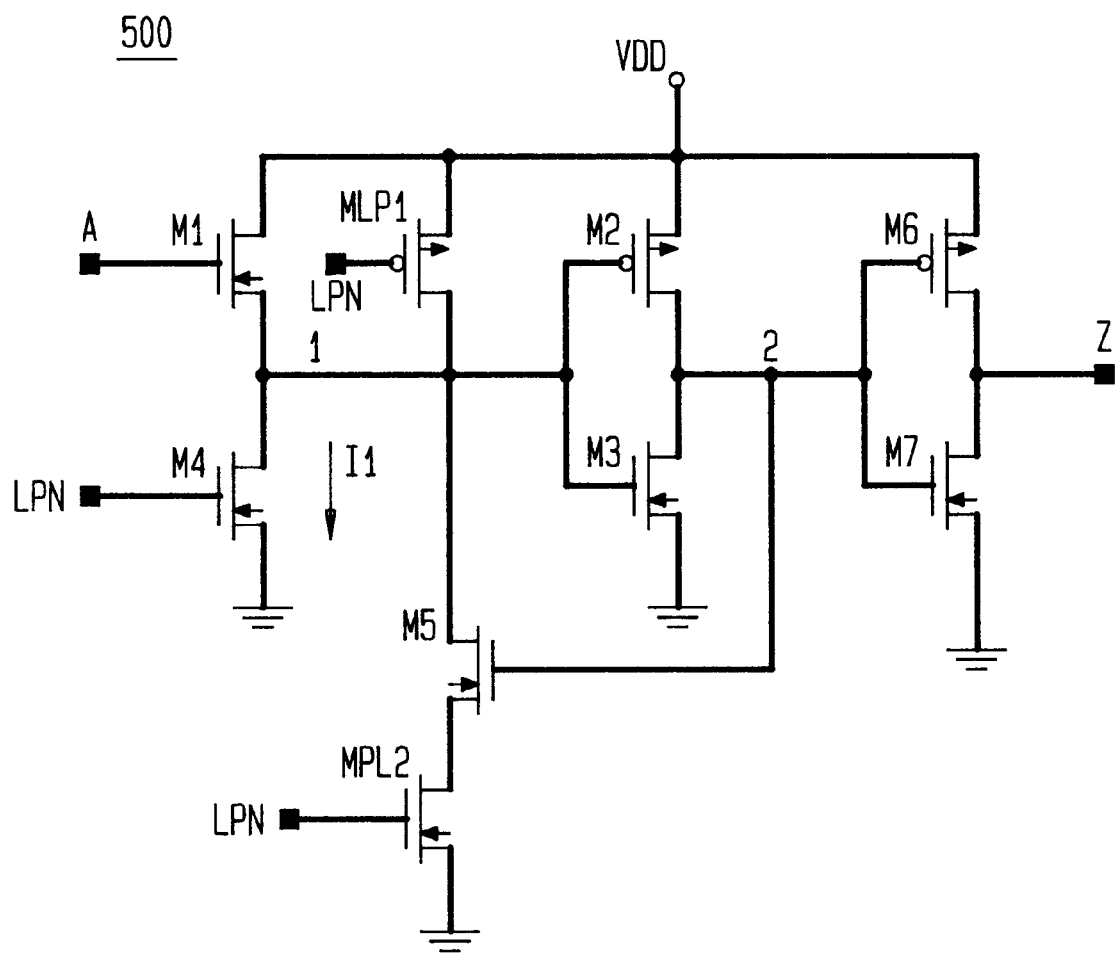

FIG. 5 shows a schematic diagram of input-buffer circuit 500, according to still another embodiment of the present invention. Circuit 500 is similar to circuit 400 of FIG. 4, except for the addition of transistors MPL1, MPL2, M6, and M7. In normal operation, the input signal LPN is high, but, when no DC power consumption is desired, LPN is held low. In this case, the output voltage VZ is pinned high regardless of the input voltage VA at node A. As such, circuit 500 provides the ability to eliminate any undesirable DC-power consumption. Transistors M6 and M7 are included to circuit 500 to buffer the output. Simulations of circuit 500 in the 0.35-micron 2.5V technology show a worst-case slow speed of under 1.5 nanoseconds driving a 1.5 picofarad load. At worst-case fast conditions, this circuit draws 0.26 milliwatts of DC power in the high state, and none in the low state.

As previously described, the circuitry of FIGS. 2–5 is implemented in a 2.5-volt technology and can tolerate input voltages up to 5 volts. As such, the "low-voltage" circuitry of FIGS. 2–5 can be interfaced to "high-voltage" circuitry implemented in a technology up to and including a 5-volt technology. As described earlier, the voltage of a particular technology is typically defined by the gate-oxide breakdown voltage and/or the punch-through between the source and drain. The present invention may also be implemented in a technology other than a 2.5-volt technology. In general, circuitry of the present invention may be implemented in any X-volt technology, and that circuitry will be able to tolerate input voltages up to 2X volts. As such, the circuitry implemented in the X-volt technology is the "low-voltage" circuitry which can be interfaced to "high-voltage" circuitry implemented in (as high as) a 2X-volt technology. For example, circuitry of the present invention may be implemented in a 1.8-volt technology that is adapted to receive and tolerate an input voltage as high as 3.6 volts. As such, such low-voltage 1.8-volt circuitry may be safely interfaced with relatively high-voltage circuitry of a 3.3-volt technology.

The use of figure reference labels in the claims is intended to identify one or more possible embodiments of the claimed subject matter in order to facilitate the interpretation of the claims. Such labeling is not to be construed as necessarily limiting the scope of those claims to the embodiments shown in the corresponding figures.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. An integrated circuit implemented in a low-voltage technology and having an input buffer coupled to other low-voltage technology circuitry, the low-voltage technology having a maximum operating power supply voltage that approximates the highest voltage that can be safely applied across each pair of nodes of a transistor implemented in the low-voltage technology without risking reliability problems, the input buffer comprising a buffer transistor coupled at one channel node to a reference voltage and coupled at the other channel node to a current source, wherein the two channel nodes are the source and the drain of the buffer transistor, the gate of the buffer transistor receives an input voltage of magnitude greater than the maximum operating power supply voltage, and the source of the buffer transistor provides a voltage to the other low-voltage technology circuitry.

2. The invention of claim 1, wherein the current source comprises a second transistor connecting the source of the buffer to ground and acting as a resistor.

3. The invention of claim 2, further comprising a third transistor connected at one channel node to the common node between the buffer and second transistors and connected at the other channel node to ground, wherein the third transistor is adapted to turn on and off to reduce power consumption in the input buffer.

4. The invention of claim 3, further comprising:
   a fourth transistor having its channel nodes connected to the channel nodes of the buffer transistor and adapted to receive a control signal at its gate; and
   a fifth transistor connected at its channel nodes between the third transistor and ground and adapted to receive the control signal at its gate, wherein the fourth and fifth transistors are adapted to turn on and off to reduce further the power consumption in the input buffer.

5. The invention of claim 4, wherein:
   the buffer transistor, the second transistor, the third transistor, and the fifth transistor are n-channel transistors; and
   the fourth transistor is a p-channel transistor.

6. The invention of claim 1, wherein the low-voltage technology is a 2.5V technology and the input buffer receives an input voltage of about 5V.

7. The invention of claim 6, wherein the 2.5V integrated circuit is interfaced with integrated circuitry of a 5V technology.

8. The invention of claim 1, wherein the low-voltage integrated circuit is interfaced with integrated circuitry of a relatively high-voltage technology.

9. A method for buffering high-voltage inputs using integrated circuitry implemented in a low-voltage technology having a maximum operating power supply voltage that approximates the highest voltage that can be safely applied across each pair of nodes of a transistor implemented in the low-voltage technology without risking reliability problems, comprising the steps of:

(a) applying a reference voltage to one channel node of a buffer transistor of an input buffer of the integrated circuitry;

(b) applying a current source to the other channel node of the buffer transistor, wherein the two channel nodes are the source and the drain of the buffer transistor; and (c) applying an input voltage of magnitude greater than the maximum operating power supply voltage to the gate of the buffer transistor, such that the source of the buffer transistor provides a voltage to other low-voltage technology circuitry.

10. The invention of claim 9, wherein the current source comprises a second transistor connecting the source of the buffer to ground and acting as a resistor.

11. The invention of claim 10, further comprising a third transistor connected at one channel node to the common node between the buffer and second transistors and connected at the other channel node to ground, wherein the third transistor is turned on and off to reduce power consumption in the input buffer.

12. The invention of claim 11, further comprising:

a fourth transistor having its channel nodes connected to the channel nodes of the buffer transistor and receiving a control signal at its gate; and a fifth transistor connected at its channel nodes between the third transistor and ground and receiving the control signal at its gate, wherein the fourth and fifth transistors are turned on and off to reduce further the power consumption in the input buffer.

13. The invention of claim 12, wherein: the buffer transistor, the second transistor, the third transistor, and the fifth transistor are n-channel transistors; and the fourth transistor is a p-channel transistor.

14. The invention of claim 9, wherein the low-voltage technology is a 2.5V technology and the input buffer receives an input voltage of about 5V.

15. The invention of claim 14, wherein the 2.5V integrated circuit is interfaced with integrated circuitry of a 5V technology.

16. The invention of claim 9, wherein the low-voltage integrated circuit is interfaced with integrated circuitry of a relatively high-voltage technology.

17. An integrated circuit implemented in a low-voltage technology and having an input buffer coupled to other low-voltage technology circuitry, the input buffer comprising a buffer transistor coupled at one channel node to a reference voltage and coupled at the other channel node to a current source, wherein:

the two channel nodes are the source and the drain of the buffer transistor;

the gate of the buffer transistor is adapted to receive an input voltage of magnitude up to two times the reference voltage to the input buffer;

the source of the buffer transistor is adapted to provide a voltage to the other low-voltage technology circuitry;

the current source comprises a second transistor connecting the source of the buffer to ground and acting as a resistor; and further comprising:

a third transistor connected at one channel node to the common node between the buffer and second transistors and connected at the other channel node to ground, wherein the third transistor is adapted to turn on and off to reduce power consumption in the input buffer;

a fourth transistor having its channel nodes connected to the channel nodes of the buffer transistor and adapted to receive a control signal at its gate; and a fifth transistor connected at its channel nodes between the third transistor and ground and adapted to receive the control signal at its gate, wherein the fourth and fifth transistors are adapted to turn on and off to reduce further the power consumption in the input buffer.

18. The invention of claim 17, wherein:

the buffer transistor, the second transistor, the third transistor, and the fifth transistor are n-channel transistors; and the fourth transistor is a p-channel transistor.

19. The invention of claim 18, wherein the low-voltage technology is a 2.5V technology and the input buffer is adapted to receive an input voltage as high as 5V.

20. A method for buffering high-voltage inputs using integrated circuitry implemented in a low-voltage technology, comprising the steps of:

(a) applying a reference voltage to one channel node of a buffer transistor of an input buffer of the integrated circuitry;

(b) applying a current source to the other channel node of the buffer transistor, wherein the two channel nodes are the source and the drain of the buffer transistor; and (c) applying an input voltage of magnitude up to two times the reference voltage to the gate of the buffer transistor, such that the source of the buffer transistor provides a voltage to other low-voltage technology circuitry, wherein:

the current source comprises a second transistor connecting the source of the buffer to ground and acting as a resistor; and further comprising:

a third transistor connected at one channel node to the common node between the buffer and second transistors and connected at the other channel node to ground, wherein the third transistor is turned on and off to reduce power consumption in the input buffer;

a fourth transistor having its channel nodes connected to the channel nodes of the buffer transistor and receiving a control signal at its gate; and a fifth transistor connected at its channel nodes between the third transistor and ground and receiving the control signal at its gate, wherein the fourth and fifth transistors are turned on and off to reduce further the power consumption in the input buffer.

21. The invention of claim 20, wherein:

the buffer transistor, the second transistor, the third transistor, and the fifth transistor are n-channel transistors; and the fourth transistor is a p-channel transistor.

22. The invention of claim 21, wherein the low-voltage technology is a 2.5V technology and the input buffer receives an input voltage as high as 5V.

* * * * *